(12) United States Patent
Fleege et al.

(10) Patent No.: US 11,385,300 B2
(45) Date of Patent: Jul. 12, 2022

(54) DIFFERENTIAL CURRENT SENSING BUSSING METHOD

(71) Applicant: Schneider Electric USA, Inc., Andover, MA (US)

(72) Inventors: Dennis W. Fleege, Cedar Rapids, IA (US); Chad Mittelstadt, Cedar Rapids, IA (US); Randall J. Gass, Cedar Rapids, IA (US); Douglas P. Vanwaart, Anamosa, IA (US); Jason Potratz, Coralville, IA (US)

(73) Assignee: Schneider Electric USA, Inc., Andover, MA (US)

( * ) Notice: Subject to any disclaimer, the term of this patent is extended or adjusted under 35 U.S.C. 154(b) by 0 days.

(21) Appl. No.: 17/099,876

(22) Filed: Nov. 17, 2020

(65) Prior Publication Data
US 2021/0072293 A1    Mar. 11, 2021

Related U.S. Application Data

(62) Division of application No. 15/672,762, filed on Aug. 9, 2017, now Pat. No. 10,852,326.

(51) Int. Cl.
*H02H 3/00* (2006.01)
*H01H 73/00* (2006.01)
(Continued)

(52) U.S. Cl.
CPC ......... *G01R 31/52* (2020.01); *G01R 19/0038* (2013.01); *G01R 19/16514* (2013.01);
(Continued)

(58) Field of Classification Search
CPC .. H02H 3/00; H02H 3/16; H02H 3/32; H01H 73/00; G01R 19/00; G01R 19/16;
(Continued)

(56) References Cited

U.S. PATENT DOCUMENTS 3,617,809 A    11/1971   Penn et al.
3,683,302 A    8/1972    Butler et al.
(Continued)

FOREIGN PATENT DOCUMENTS

CN    101923989 A    12/2010
CN    105044425 A    11/2015
(Continued)

OTHER PUBLICATIONS

Extended European Search Report for European Patent Application No. 18186711.0 dated Nov. 20, 2018, 7 pages.
(Continued)

*Primary Examiner* — Neel D Shah
(74) *Attorney, Agent, or Firm* — Locke Lord LLP

(57) ABSTRACT

The line power and neutral conductors for a circuit interrupter such as a miniature circuit breaker, using ground fault sensing via a current transformer, are arranged as a rigid conductor formed from a flat plate and surrounding and holding an insulated flexible conductor when passing through the Ground Fault Interrupter current transformer. The rigid conductor can provide a shaped current path to maximize the effectiveness of the current transformer.

19 Claims, 10 Drawing Sheets

(51) Int. Cl.
| | |
|---|---|
| *G01R 19/00* | (2006.01) |
| *G01R 19/165* | (2006.01) |
| *G01R 19/20* | (2006.01) |
| *G01R 31/52* | (2020.01) |
| *H02H 1/00* | (2006.01) |
| *H01H 83/22* | (2006.01) |
| *G01R 31/50* | (2020.01) |
| *G11C 7/06* | (2006.01) |
| *H03F 3/45* | (2006.01) |
| *H02H 3/16* | (2006.01) |
| *H01H 83/20* | (2006.01) |
| *H01H 83/14* | (2006.01) |
| *H02H 3/10* | (2006.01) |
| *H02H 3/08* | (2006.01) |
| *H02H 3/33* | (2006.01) |

(52) U.S. Cl.
CPC ....... *G01R 19/16571* (2013.01); *G01R 19/20* (2013.01); *G01R 31/50* (2020.01); *G11C 7/062* (2013.01); *H01H 83/226* (2013.01); *H02H 1/0015* (2013.01); *H03F 3/45183* (2013.01); *H03F 3/45237* (2013.01); *H01H 2083/146* (2013.01); *H01H 2083/148* (2013.01); *H01H 2083/201* (2013.01); *H02H 3/08* (2013.01); *H02H 3/105* (2013.01); *H02H 3/16* (2013.01); *H02H 3/33* (2013.01)

(58) Field of Classification Search
CPC ...... G01R 19/165; G01R 19/20; G01R 31/02; G01R 31/12
See application file for complete search history.

(56) References Cited

U.S. PATENT DOCUMENTS

| | | | |
|---|---|---|---|
| 3,725,741 A * | 4/1973 | Misencik | ................ H01F 38/30 |
| | | | 361/45 |
| 3,736,468 A | 5/1973 | Reeves et al. | |
| 5,341,281 A | 8/1994 | Skibinski | |
| 5,446,431 A | 8/1995 | Leach et al. | |
| 5,841,616 A | 11/1998 | Crosier | |
| 6,232,857 B1 | 5/2001 | Mason, Jr. et al. | |
| 7,639,461 B2 | 12/2009 | DiSalvo et al. | |
| 2003/0174030 A1 | 9/2003 | Chopra et al. | |
| 2003/0223161 A1 | 12/2003 | Elms et al. | |
| 2007/0208520 A1 * | 9/2007 | Zhang | ................... H02H 3/335 |
| | | | 702/58 |
| 2010/0148901 A1 | 6/2010 | Powell et al. | |
| 2010/0264000 A1 | 10/2010 | Zende et al. | |
| 2015/0301087 A1 | 10/2015 | Moell et al. | |

FOREIGN PATENT DOCUMENTS

| | | |
|---|---|---|
| EP | 0076999 A2 | 4/1983 |
| EP | 0769197 B1 | 4/1997 |
| RU | 2396661 C1 | 8/2010 |
| RU | 103038 U1 | 3/2011 |

OTHER PUBLICATIONS

Search Report for corresponding Russian Patent Application No. 2018128282, dated Nov. 17, 2021, 2 pages.

* cited by examiner

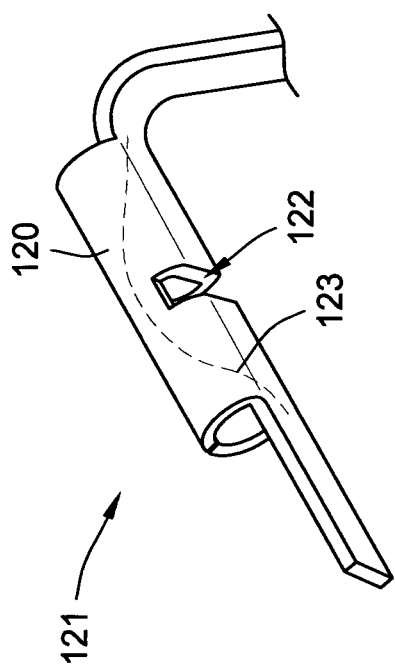
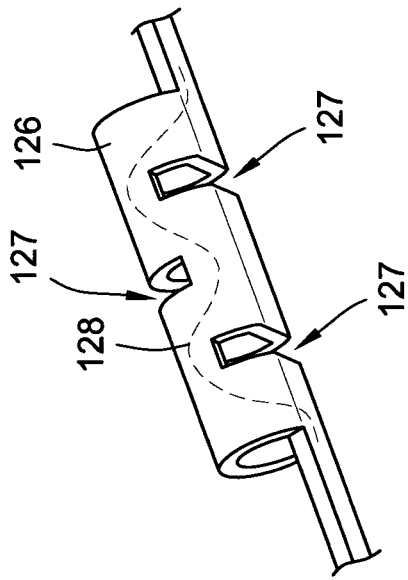
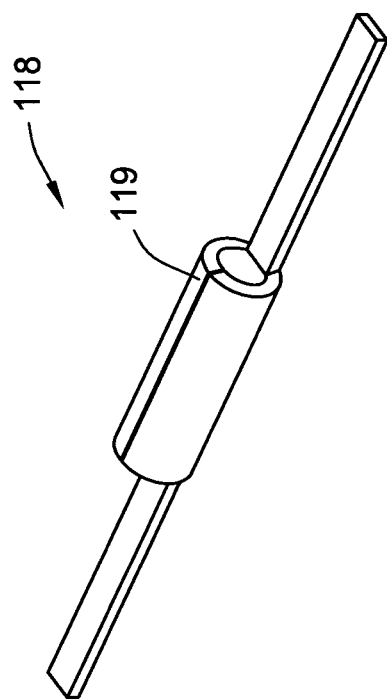

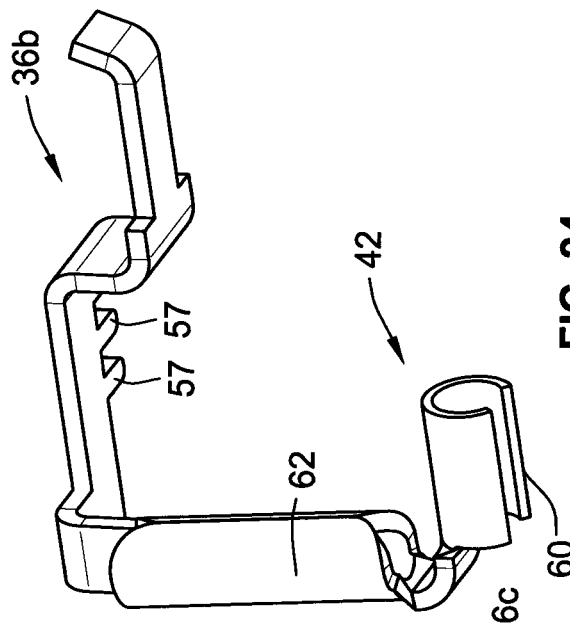
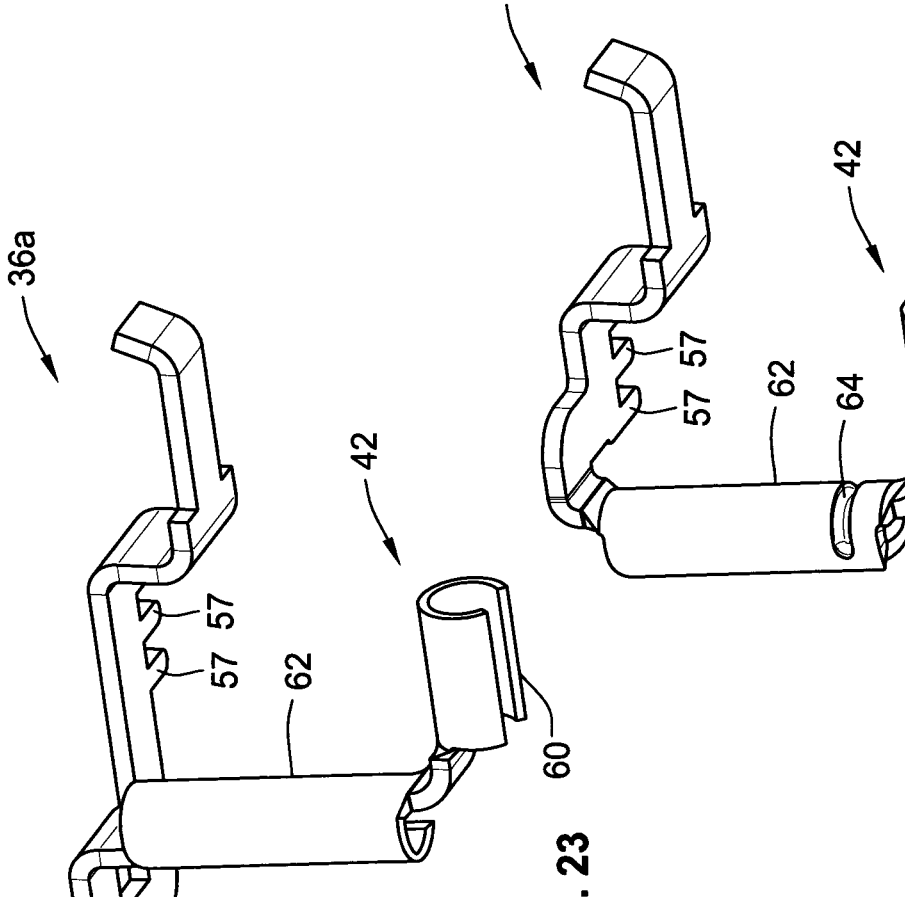

DIFFERENTIAL CURRENT SENSING BUSSING METHOD

PRIORITY INFORMATION

The present application is a division of and claims priority to U.S. patent application Ser. No. 15/672,762, filed on Aug. 9, 2017, which is herein incorporated by reference as if fully set forth in this description.

BACKGROUND OF THE INVENTION

1. Field of the Invention

The present invention relates to circuit interrupters that utilize ground fault sensing as part of the fault detection methods, including circuit breakers or receptacles, and particularly to ground fault sensing miniature circuit breakers and outlet receptacles found most commonly in residential use.

2. Discussion of the Art

FIG. 1 illustrates the basics of a known circuit breaker 10 of the Ground Fault Interrupter type with a schematic representation therein of the line power current path 11. The line current path starts at the line power terminal 13 of the breaker 10 and continues through the separable contacts 15 and a toroidal current transformer current sensor 17 to the load terminal 18 which is wired out to the branch load 22, here represented as a motor. A mechanical "side" or portion 16 of the circuit breaker 10 contains thermal and magnetic trip units 19, typically a bimetal and a magnetic yoke assembly, respectively, which are components for tripping, i.e. separating, the contacts 15, in the event of overcurrent conditions.

An electronic "side" or portion 20 of the arc fault sensing circuit breaker 10 contains the current sensor in the form of current transformer 17, and associated electronics 21 for evaluation of Ground Fault events. The electronics 21 control an actuator 23, typically a solenoid, whose function is also to trip the separable contacts 15 and remove power from the load 22.

The return neutral current path 24 from the load 22 travels from the load 22 to the neutral terminal 28 through the current transformer current sensor 17 and out to the neutral return wire 26. It will be appreciated that a plug on neutral type breaker will have a terminal clip rather than, or in addition to, the illustrated pigtail wire.

The current flow direction of the power conductors and the neutral conductors are in the opposite directions when they are routed through the Ground Fault current transformer 17 sensor housing. Each current carrying conductor will produce a magnetic flux which is in compliance with the "Right Hand Rule" used to determine flux direction. When the two conductors are carrying the same level of current in opposite directions, the flux of one conductor will cancel the flux from the other conductor. This then has a net flux value of zero. If there is an equal current exiting and then returning back through the Ground Fault circuit breaker, the Ground Fault sensor will output no signal. If there is an imbalance of current in the circuit wires, then the Ground Fault Interrupter sensor will output a current proportional to the current imbalance and if this imbalance exceeds a predetermined threshold, the Ground Fault circuit breaker will detect the presence of a ground fault and interrupt the electrical circuit.

A recognized problem with Ground Fault Interrupter sensors is that if the conductors are not located properly in the sensor, uneven magnetic fields throughout the current sensor assembly can cause an output current from the current sensor, even when the total current through the conductor paths are balanced. The result is an inaccuracy in the current sensor output known as load shift error. Typically this error is compensated for by twisting the main conductors (line and neutral) as they pass through the Ground Fault current transformer. It has been proposed, e.g. by U.S. Pat. No. 3,725,741 to Misencik, to replace the usual twisted pair of main conductors (line and neutral) with a rigid tubular outer conductor surrounding an insulated flexible conductor passing through the aperture of the Ground Fault Interrupter current transformer.

SUMMARY OF THE INVENTION

The line power and neutral conductors for a Ground Fault sensing interrupter are arranged as an improved rigid conductor surrounding and holding an insulated flexible conductor when passing through the current sensing transformer. The rigid conductor may be shaped to provide controlled current flow distribution for adjusting any ground fault load shift through the current transformer and more evenly distributing the magnetic field through the current transformer. Conversely, in some aspects of the invention a deliberate ground fault load shift may be provided by the apparatus if desired.

A Ground Fault current sensing package according to the present invention utilizes a so-called "faux coax bus bar" i.e. a rigid conductor encompassing and holding a flexible insulated conductor, passing through the current transformer core in place of twisted wires to help control ground fault load shift performance inside the Ground Fault current sensor. Aspects of the present invention can be used to control current distribution across the faux coax for a better output from the current sensor. The faux coax arrangement also provides for easier construction while also eliminating the need for a twisted wire assembly and maintaining a more consistent routing path for the Line and Neutral wires to obtain a more consistent load shift performance.

In one aspect, the present invention provides for a Ground Fault sensing miniature circuit breaker with line power and neutral power current paths within an apertured current transformer for the detecting of ground fault current anomalies, comprising: a rigid conductor surrounding and holding a flexible conductor; the rigid conductor and the flexible conductor passing through the aperture of the Ground Fault current transformer inside of the miniature circuit breaker with the rigid conductor being shaped to control current density, and resultant flux, within the core.

In some aspects of the present invention the rigid conductor is connected to and forms a part of the current path of the Neutral connection. Alternatively, the rigid conductor could form a part of the Line power connection and the neutral line could be connected through the flexible conductor encompassed and held by the rigid conductor. The rigid conductor may be formed from a flat blank having first and second terminal strips and a wider central portion which has been rolled into a substantially tubular form for fitting through the current transformer. The rigid conductor can also have current density directing features integrated therein to create increased resistance to the flow of current such as where the electrical resistance feature in the rigid conductor is created by a narrowed wall thickness or through hole in the section of the substantially tubular form. Also for example the tubular form might, e.g., be formed by a roll of 180 degrees or 270 degrees between input and output terminals to control current flow and flux patterns.

Other aspects of the present invention offer an improvement to a Ground fault interrupter apparatus of the differential transformer type such as a miniature circuit breaker of the ground fault sensing type comprising: a current transformer with an apertured magnetic core; a printed circuit board with electronics for detection of ground fault events; first and second primary conductors extending through the core; the first primary conductor being a substantially rigid conductor with a tubular portion located inside the core and further having nontubular second and third portions outside the core extending at angles to the tubular portion, one of the second or third portions secured to the printed circuit board; the second primary conductor being a flexible wire held inside the tubular portion of the first primary conductor in a substantially coaxial arrangement; the current sensor further having a secondary winding comprising a plurality of turns on the core; a trip circuit responsive to sensed signals on the secondary winding. In some aspects of the invention the rolled central portion does not necessarily form a fully closed tube. Other aspects of the present invention present an improvement comprising the rigid conductor being formed by starting from a flat conductive piece and having a rolled central portion of the flat piece thereby creating the tubular conductor and flat terminal strips. Again, features may be added to the structure of the rigid conductor to provide shaped current flow, wherein the features can include through-holes in the wall of the rolled central portion or include narrowed wall thickness in the wall of the rolled central portion. It will be appreciated upon understanding the present invention that the rigid conductor can provide other current routing advantages within the circuit interrupter such as the elimination of jumper wires.

BRIEF DESCRIPTION OF THE DRAWINGS

The foregoing and other advantages of the disclosed embodiments will become apparent upon reading the following detailed description and upon reference to the drawings, wherein:

FIGS. 5-25 detail various alternative embodiments of the rigid conductor.

DETAILED DESCRIPTION

As an initial matter, it will be appreciated that the development of an actual commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

Words of degree, such as "about," "substantially," and the like are used herein in the sense of "at, or nearly at, when given the manufacturing, design, and material tolerances inherent in the stated circumstances" and are used to prevent the unscrupulous infringer from unfairly taking advantage of the invention disclosure where exact or absolute figures and operational or structural relationships are stated as an aid to understanding the invention.

The person of ordinary skill in the art will appreciate that the well known components of an electronic miniature circuit breaker unnecessary to the exposition of the present invention are not described in detail here, but will be understood to be present in a functioning circuit interrupter as briefly explained above. While shown here in the context of a miniature circuit breaker it will be appreciated by those in the art that the invention may be applicable to a variety of Ground Fault sensing apparatus, such as other forms of circuit interrupter devices, receptacles, or monitoring systems.

Figure 1:
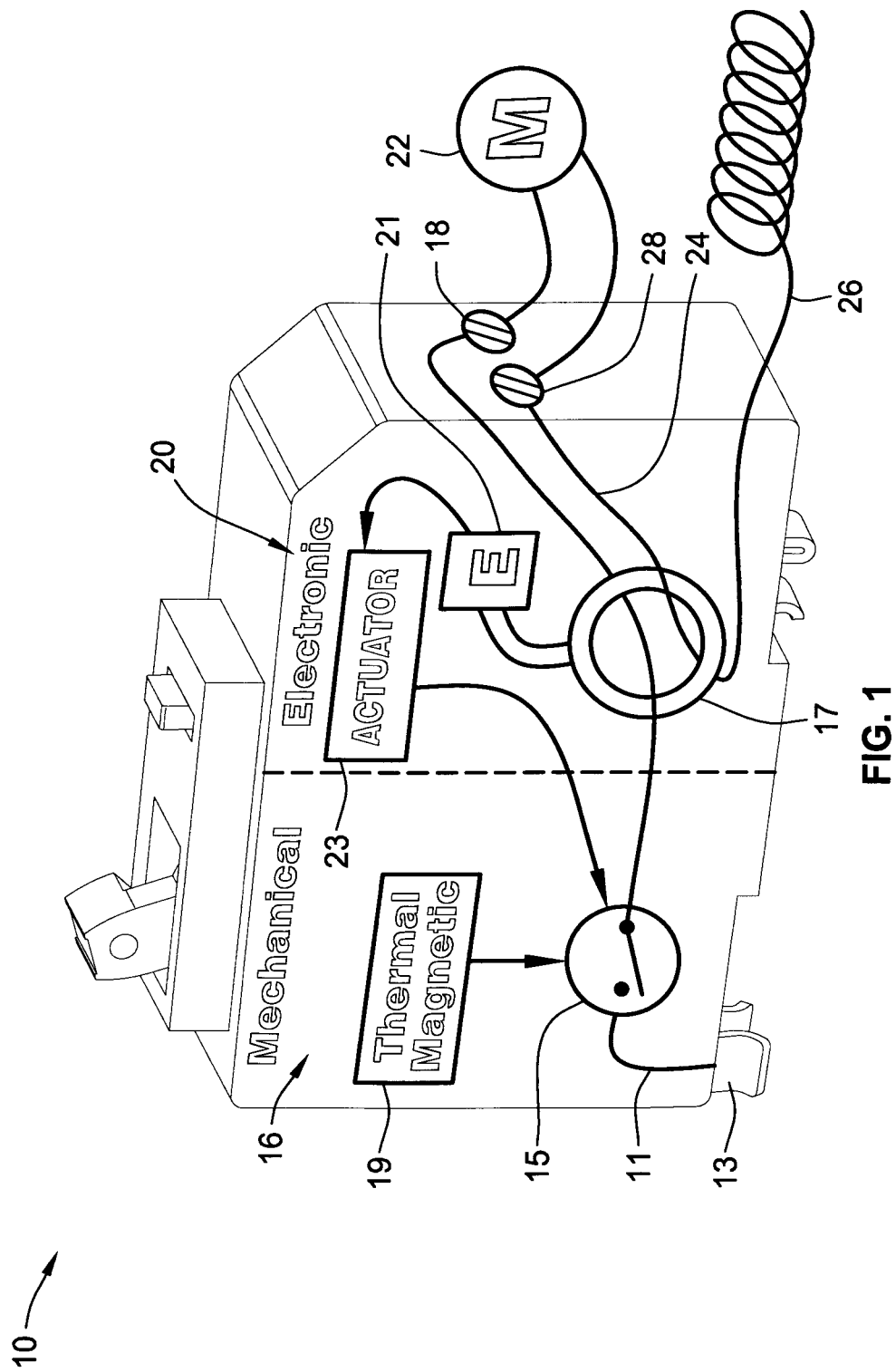
FIG. 1 is a schematic illustration of the working parts of an exemplary ground fault or dual function circuit breaker as known in the art.
Figure 2:
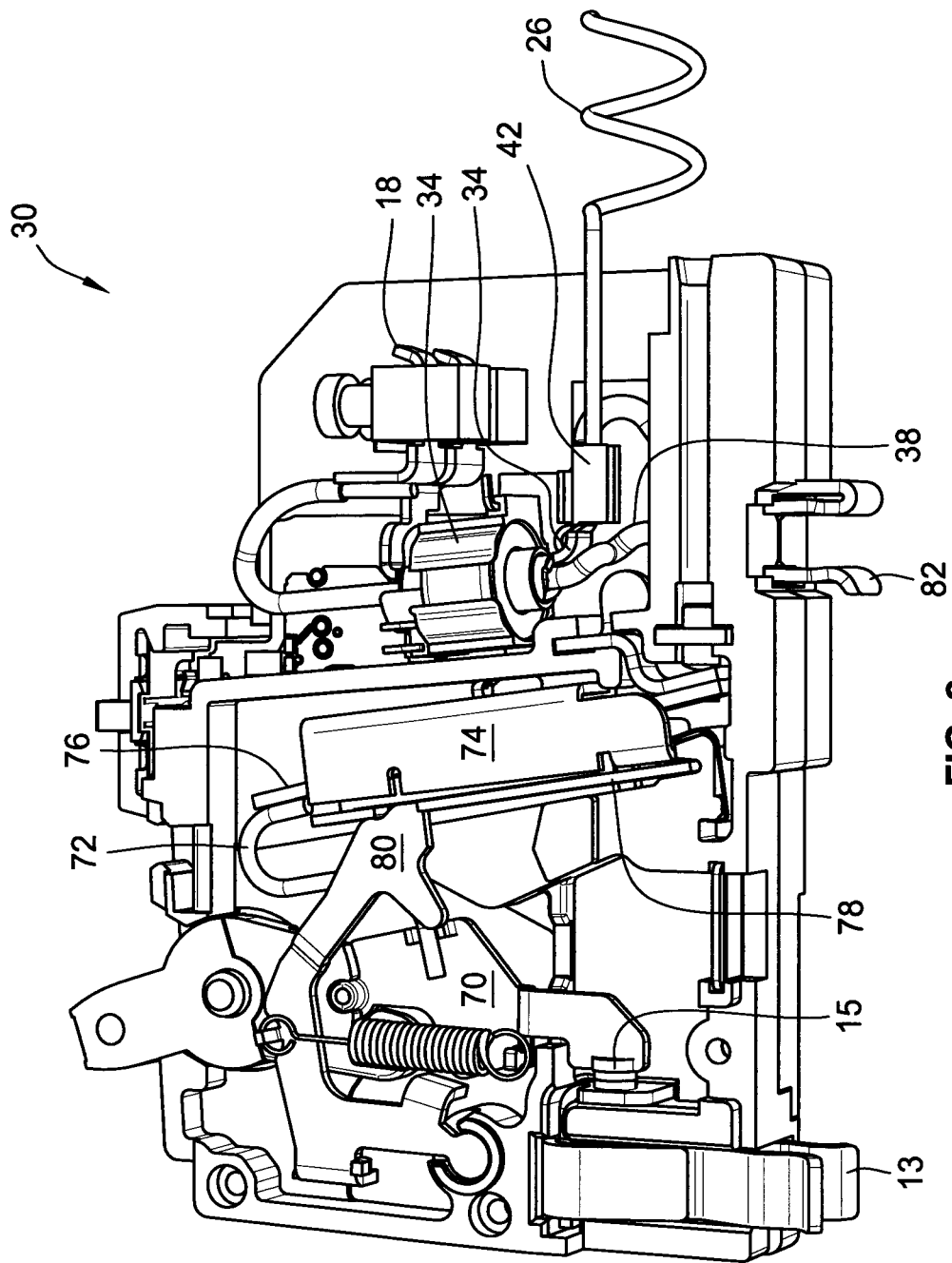
FIG. 2 is a perspective view of the interior of the mechanical side of a dual function circuit breaker of the present invention.

FIG. 2 illustrates the "mechanical side," i.e. portion, of a partially constructed arc fault sensing circuit breaker 30 according to certain aspects of the present invention. The terms "side" and "portion" are used herein to convey the sense of a functional grouping which may or may not exist as discrete physical layouts within the design of the breaker. Further, some common reference numbering between FIG. 1 and the remaining figures may be used herein where the component functionalities are substantially in common between the two. The line (power) current path starts at the line power terminal 13 of the breaker 30 and continues through the separable contacts 15 into the movable contact arm 70 and travels by wire 72 through the mechanical trip portions of the yoke 74, latch plate 78, and bimetal 76 which cause the mechanical trip by separating the latch plate 78 from the trip lever 80. The current path then passes through the Ground Fault Interrupter current transformer 34, as further explained below, before exiting to the load terminal 18 which is wired out to the branch load 22 (FIG. 1).

Figure 3:
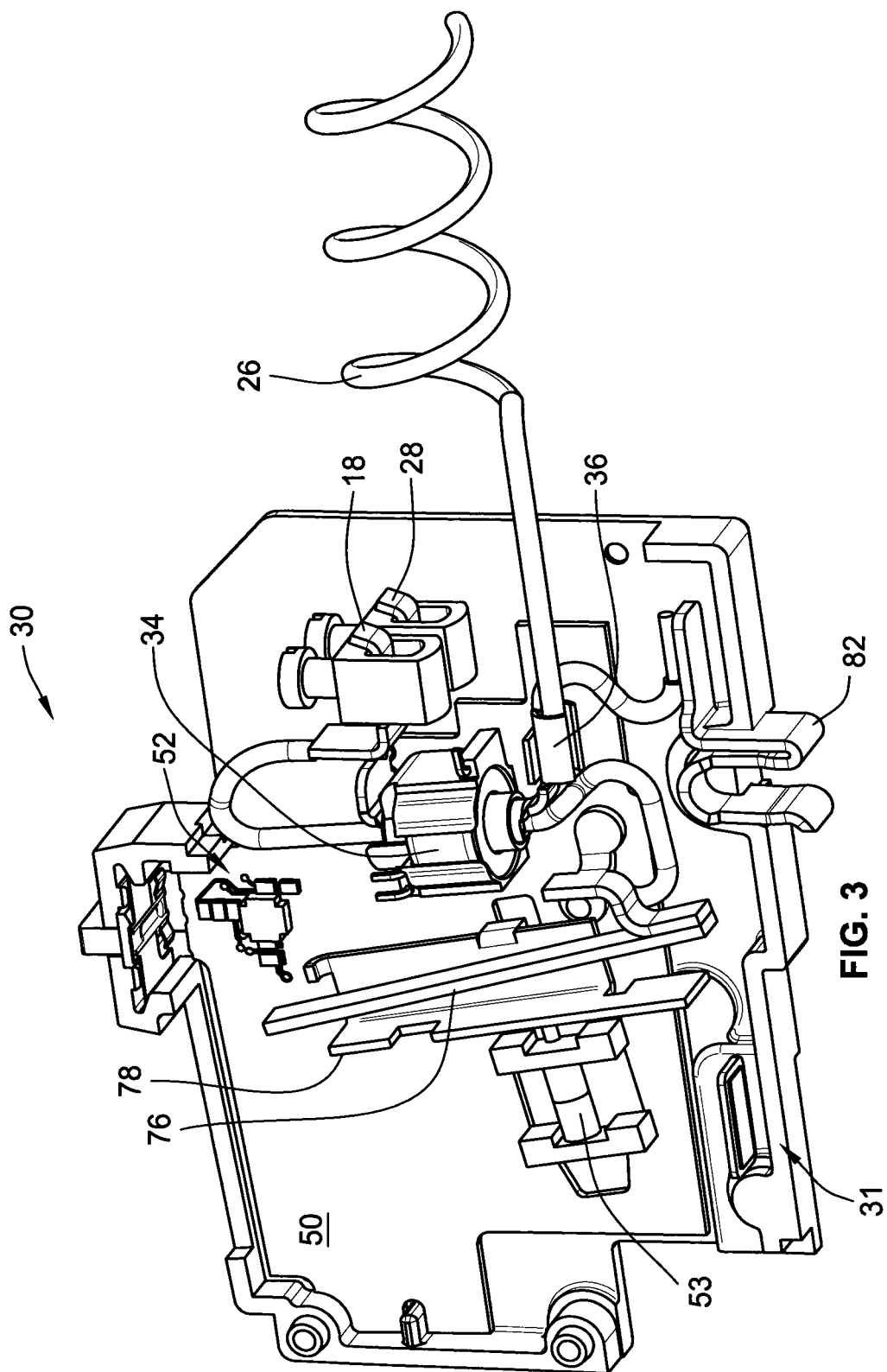
FIG. 3 is a perspective view of the electronics side of the circuit breaker of FIG. 2 of the present invention.

FIG. 3 illustrates one possible electronic "side," i.e. portion, 31 of the arc fault sensing circuit breaker 30 containing the current transformer current sensor 34, and associated electronics 52 mounted to a PCB 50 for evaluation of Ground Fault and Arc Fault events. The electronics 52 control a solenoid actuator 53 whose function is also to move the latch plate 78 from the trip lever 80 to trip the separable contacts 15 and remove power from the load (not shown). The return (Neutral) current path from the load travels from the Neutral return terminal 28, which is a second end of the rigid conductor 36, through the current sensor current transformer 34, as further explained below, and out to the neutral return wire (pigtail) 26 or the plug on neutral clip 82, both of which are shown here for the sake of explanation.

Figure 4:
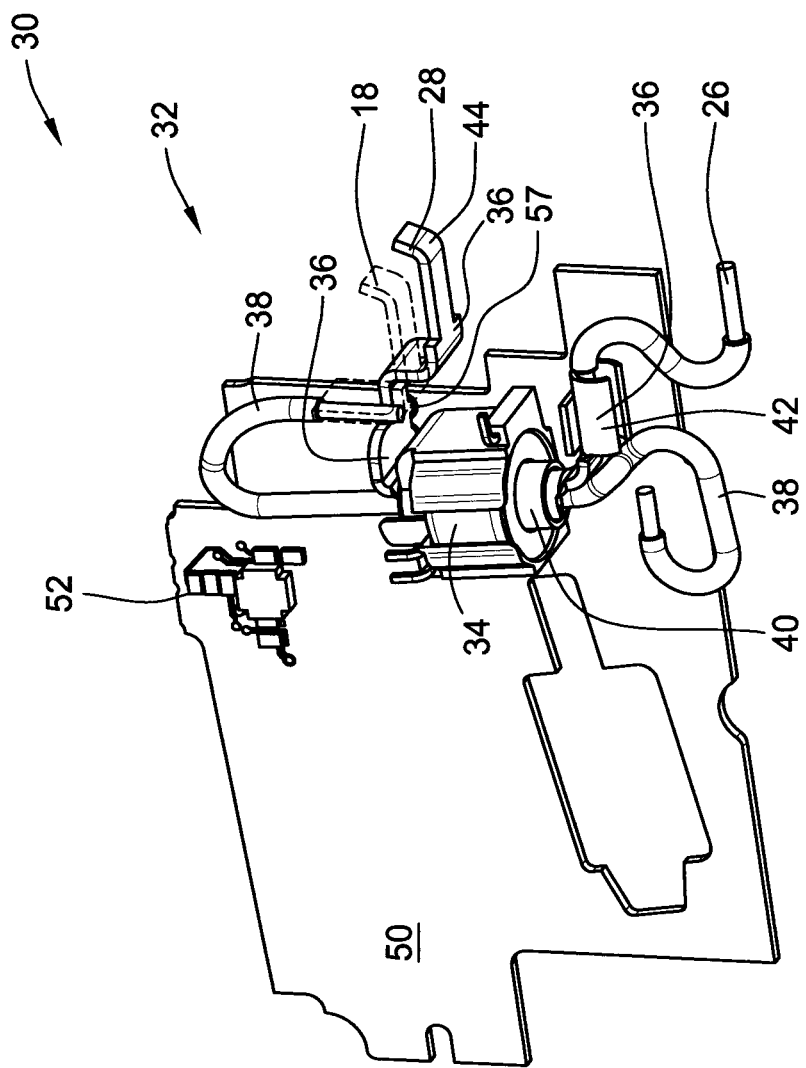
FIG. 4 is a perspective view of a Dual Function circuit breaker PCB with the integrated arc fault and ground fault current sensing package of the present invention utilizing one ground fault current transformer.

Referencing particularly FIG. 4, as is understood in the art, the current transformer 34 includes a wound toroidal core within its case. Through the aperture 40 of the toroidal transformer core is passed a rigid conductor 36 surrounding and holding an insulated flexible conductor 38, i.e. a wire, arranged here for carrying the line power current through the circuit breaker and ending at a load terminal 18 (in phantom) for connection to a branch load line. This arrangement creates a so-called "faux coaxial conductor" for the ground fault current sensing apparatus of the present invention. The rigid conductor 36 is connected to a neutral return wire 26, sometimes known as a pig tail, at a first end 42 of the rigid conductor 36, as part of the neutral current path through the circuit breaker 30. The second end 44 of the rigid connector 36 is formed into the Neutral terminal 28 of the circuit breaker for connection to the neutral line of the branch load 22 (FIG. 1).

The rigid connector 36 is mounted, e.g. soldered, to a printed circuit board (PCB) 50 along with the various electronic components, collectively 52, necessary to perform the circuit interruption functions of the breaker 30. Leads may be incorporated into the PCB 50 and make contact with the rigid conductor 36 where it is soldered to the board such as at one of its pins 57 (see FIG. 24), to be connected for providing the current paths necessary to operate the breaker without excessive use of jumper wires.

Figure 5:
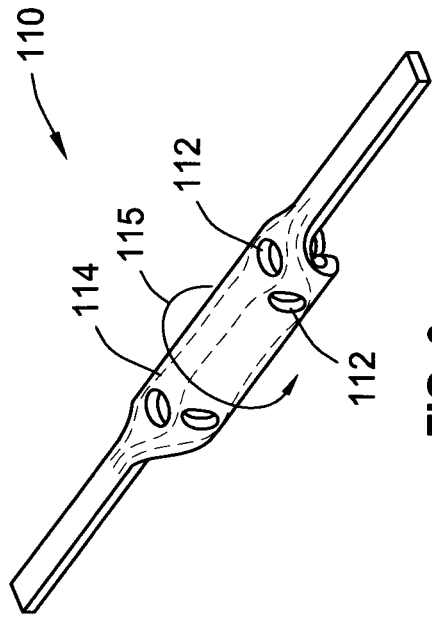

FIG. 5 illustrates a first alternative version 110 of the rigid conductor which fits into the tubular opening inside the center of the current transformer and allows a second flexible conductor (38, FIG. 4) to pass through the center tubular portion 111 of the rigid conductor 110.

Figure 6:
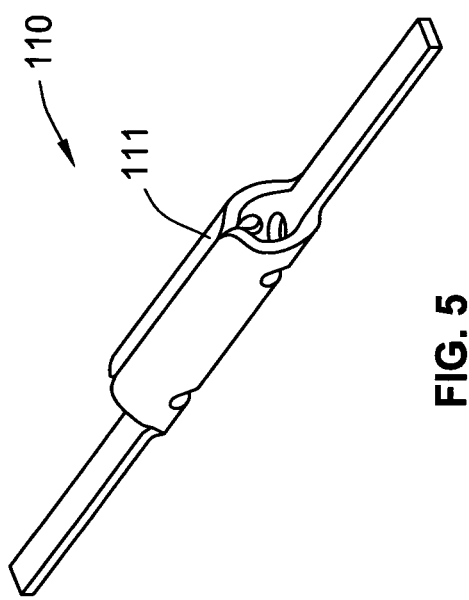
Figure 7:
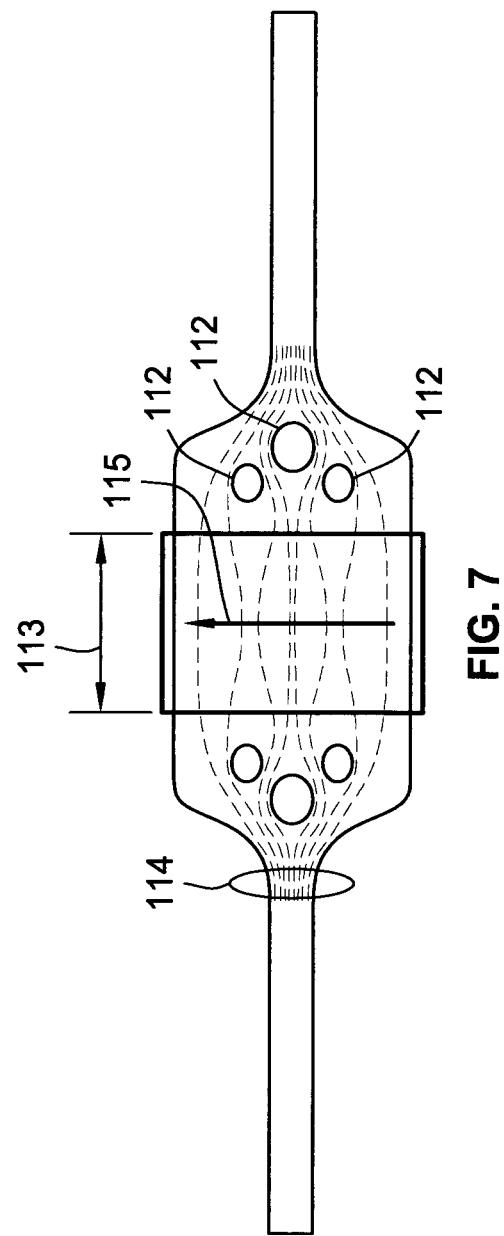

FIGS. 6 and 7 illustrate a current flow 114 through the rigid conductor 110. FIG. 7 shows the flat pattern of the conductor 110 before rolling of the center tubular portion 111 to create a tube. A pattern of holes, collectively 112, at each end of the tubular portion 111 redirects the current flow through the center body area 113 to evenly distribute the current flow lines 114 about the entire width, resulting in a controlled current density and a substantially parallel direction of current flow. The well controlled current density and direction will produce a good flux pattern 115 for minimal load shift error. This controlled area 113 of the rigid conductor 110 will be located in the center of the GFI current transformer 34 (FIG. 4) during operation.

The object of this design is to produce parallel paths of current flow to produce a well oriented flux pattern to offset the flux pattern of the flexible conductor wire inside the rigid conductor, with the resultant flux to be in line with the sensor core and windings. The current path of the captive flexible conductor (not shown) will produce flux lines in a direction that is in direct opposition to the rigid conductor current path.

FIG. 8 illustrates a basic construction second alternative 118 of rigid conductor wherein the unpierced broad central portion 119 of the flat conductor blank merely has its lateral edges folded into a tube with zero degrees of twist. However the current path in this basic embodiment was found to be fairly uneven and was generally concentrated in a straight line between the ends.

FIG. 9 illustrates a third alternative version 120 of the rigid conductor with a rolled central portion 121 of zero degrees twist similar to that of FIG. 8 but with a slot 122 impressed in the tubular middle section 121 which redirects the current flow 123 to the outer edges of the tube. This design produced better flux patterns than the alternative of FIG. 8.

FIG. 10 illustrates a fourth alternative version 126 of the rigid conductor using three slots 127 instead of the one slot 122 in FIG. 9. These extra slots 127 provide a redirection of the current path 128 to achieve a different current distribution if desired.

Figure 11:
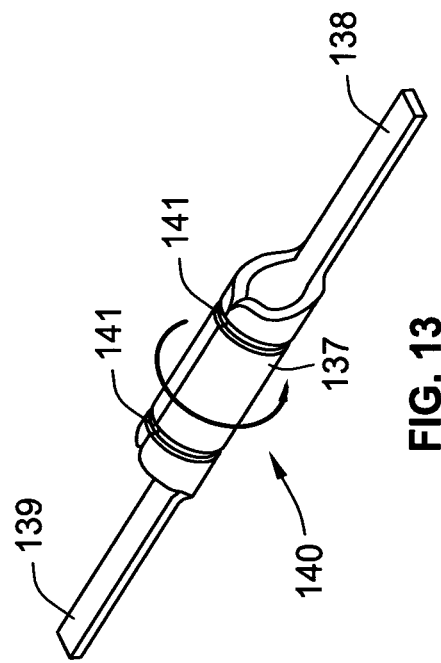
Figure 12:
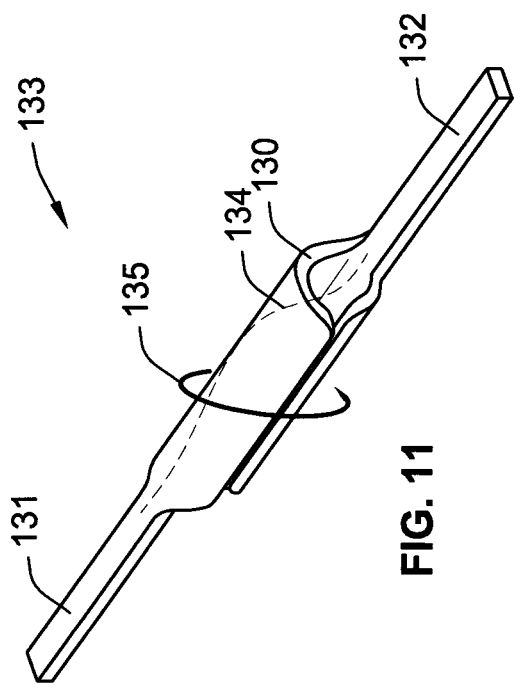

FIG. 11 illustrates a fifth alternative version 130 of the rigid conductor. FIG. 12 is a flat pattern of the rigid conductor of FIG. 11 showing the general current path 134 and flux pattern 135. The ends 131, 132 of the rigid conductor 130 are 180 degrees out from one another since the middle section 133 has been put through a half roll twist during formation from flat (FIG. 12) to tubular (FIG. 11). This embodiment was found to redirect the current flow for a good current density distribution and flux pattern 135 throughout the central portion.

Figure 13:
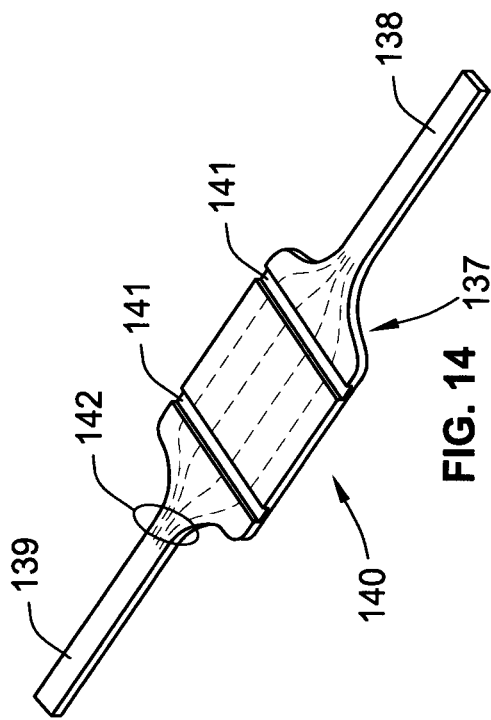
Figure 14:
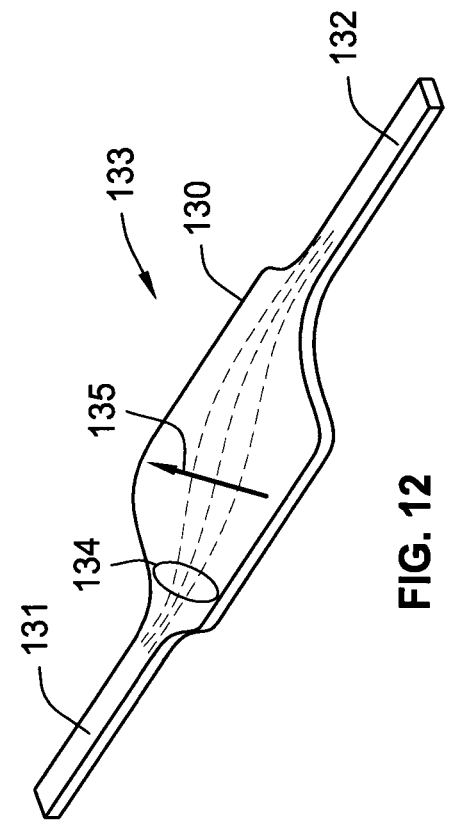

FIGS. 13 and 14 illustrate a fifth alternative version 137 rigid conductor. The flat ends 138, 139 are not offset as the central tubular portion 140 was formed with a zero degree roll, i.e. without twisting. The wall areas of reduced cross sections 141 at each end of the rigid conductor tubular center 140 are an alternative to the holes of the alternatives shown in FIGS. 5, 9 and 10. These reduced cross sections 141 will create resistance to current flow and will cause the current to seek a wider path as shown by the current lines 142 of FIG. 14.

Figure 15:
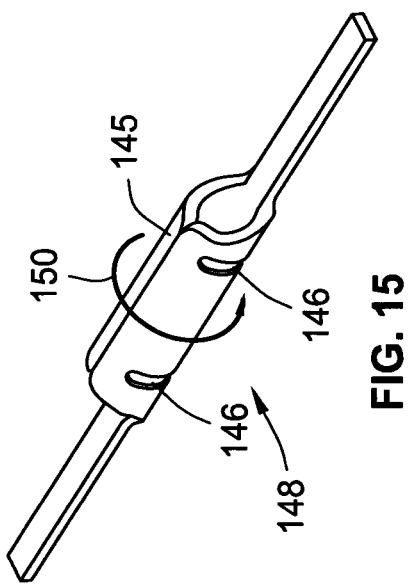
Figure 16:
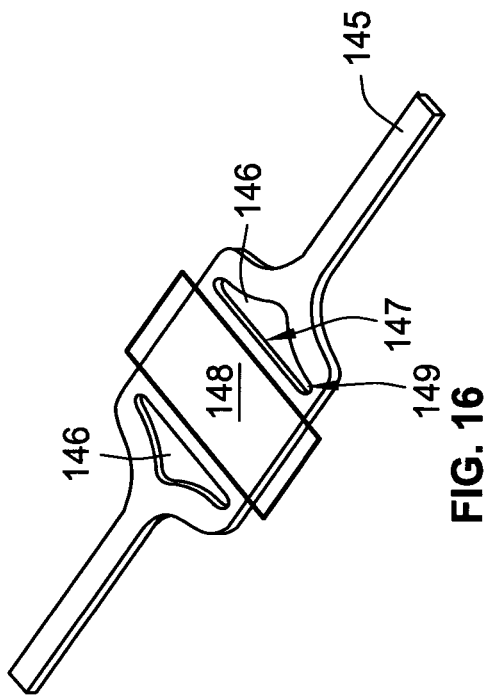

FIGS. 15 and 16 illustrate a sixth alternative version 145 of the rigid conductor similar to the fifth alternative but with the reduced cross sections 146 shaped to create different resistance values in the center 147 of the tubular body 148 versus the outer areas 149. The resistance value varies to cause the current flow to be evenly distributed about the center portion 147 of the rigid conductor. Since current flows highest in the least resistance path, the area of resistance of the cross section is varied to be higher in the center 147 and to offer the least resistance on the outer areas 149 to achieve good distribution of current and flux path 150.

Figure 17:
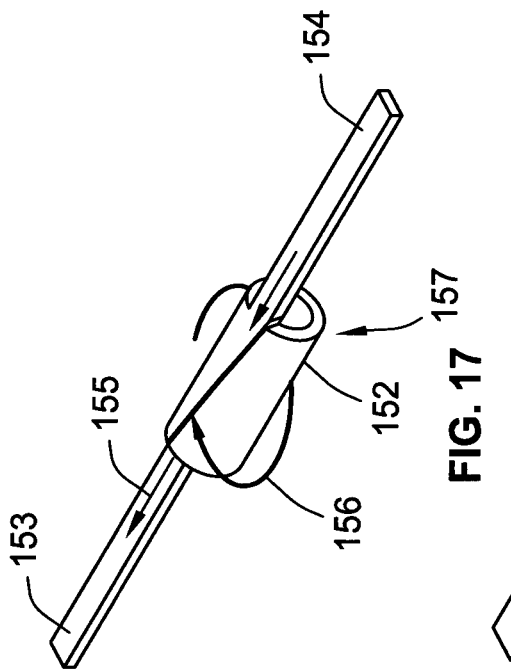
Figure 18:
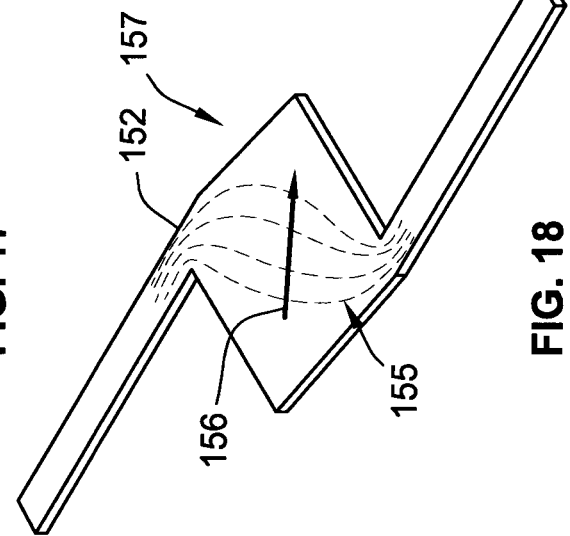

FIGS. 17 and 18 illustrate a seventh alternative 152 version of the rigid conductor. The end tabs 153, 154 of the rigid conductor are 360 degrees out from one another since the middle section 157 has been put through a full roll twist during formation from flat (FIG. 18) to tubular (FIG. 17). This redirects the current flow 155 for a good density distribution throughout the part. Arrows 156 show the general flux direction which is noted to be at an angle to normal of the central axis of the conductor as a whole.

Figure 19:
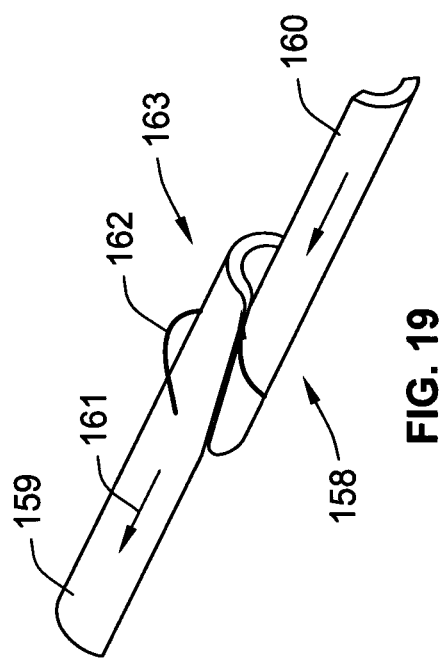
Figure 20:
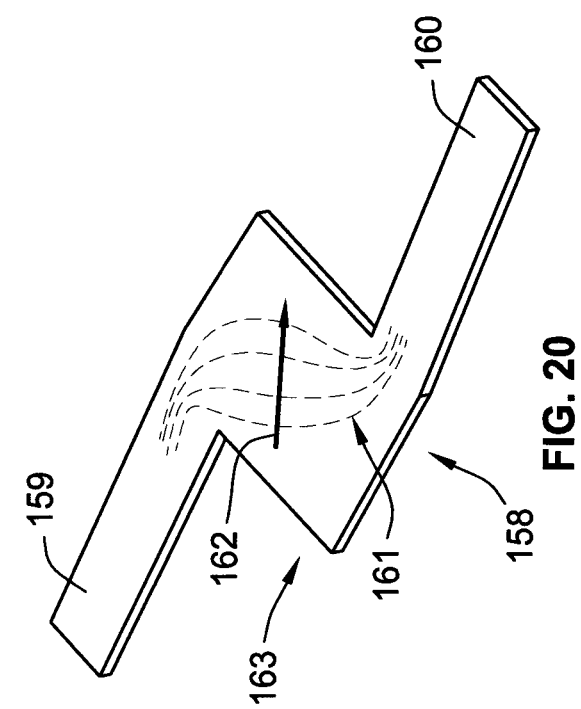

FIGS. 19 and 20 Illustrate an eighth alternative 158 of the rigid conductor. The end tabs, i.e. terminals 159, 160 of the rigid conductor are 270 degrees out from one another since the middle section 163 has been put through a three-quarter roll twist during formation from flat (FIG. 20) to tubular (FIG. 19). Arrows 162 show the general flux direction which is noted to be at an angle to normal of the central axis of the conductor as a whole.

Figure 21:
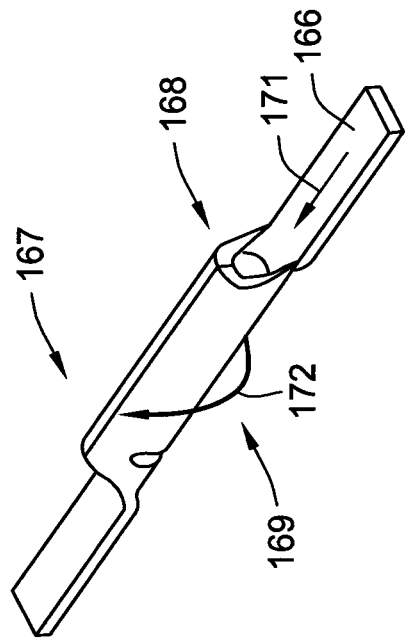
Figure 22:
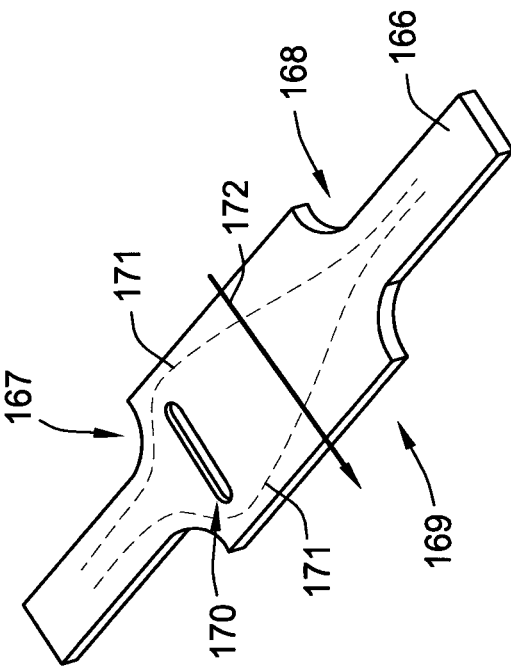

FIGS. 21 and 22 illustrate an ninth alternative 166 of the rigid conductor. The first end 167 of the center area 169 has a resistive area 170 shaped by a reduced cross sectional area. The first end 167 forces the majority of the current 171 to be routed around the outer edges of the pocket 170 to the outer edges of the center section 169. After passing the pocket 170 the current 171 is then free to travel diagonally inward through the center section 169 to be brought together again at the opposite end 168 of the center section 169 to achieve a changed distribution of current 171 and flux 172 paths throughout the length of the rigid conductor 166. This construction will result in a different flux output between the rigid conductor and captive flexible conductors, thus providing a different dispersion of flux to deliberately produce a current and consequent load shift output in the current transformer sensor winding.

FIGS. 23, 24, and 25 show three possible variants 36a, 36b, 36c of the rigid conductor 36 folded as if assembled into the faux co-axial conductors through the Ground Fault Interrupter current transformer. As will be understood from the foregoing discussion, each rigid conductor 36a, 36b, 36c can start as a flat plate-like part to be stamped, rolled and bent during the process of constructing the rigid conductor of the faux coax sensor package. In each variant, a first end 42 of the rigid conductor 36 is rolled to form an open cylinder tubular connection point 60 for a flexible wire within the breaker. While illustrated in the foregoing description as carrying the Neutral current, it will be appreciated that the rigid conductor 36 could just as well carry the line current in other arrangements. A central tubular portion 62, unclosed here in all three variants, is formed by rolling a wider central portion of the plate. The central tubular portion 62 of FIG. 23 is rolled and/or twisted 180 degrees. The central tubular portion 62 of FIG. 24 is rolled and/or twisted through 90 degrees and the central tubular portion 62 of FIG. 25 has a so-called "zero degree" twist where the edges of the central plate are merely turned up towards one another without a twist through the axis of the starting plate. The central portion 62 of FIG. 25 further has a feature 64 for adding resistance to current flow stamped into the central portion as a reduced thickness of the wall section.

A multitude of variations for the faux coax concept could be utilized to optimize load shift performance using variations of geometries; some examples being coax shape, length, material thickness, etc.; to optimize voltage drop at both typical 60 Hz or 50 Hz as well as at higher frequency signatures during arcing faults.

The rigid conductor in conjunction with underlying PCB conductors might further be used to replace separate jumper wire connections to the module. For instance power and push-to-test (PTT) inputs could be incorporated through the rigid conductor rather than as jumper wires. It will also be appreciated that the body of the rigid conductor could be insulated to reduce dielectric concerns to surrounding components. Again it will be appreciated that the rigid conductor 36 could be connected through either the Line Power (hot) wire path or the Neutral Return wire path in the construction of the faux coax arrangement.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the invention as defined in the appended claims.

The invention claimed is:

1. A miniature circuit breaker of the arc fault sensing type comprising:
a current transformer with an apertured magnetic core;
electronics configured to detect ground faults;
first and second primary conductors extending through the core;
the first primary conductor being a substantially rigid conductor with a tubular portion located inside the core and further having nontubular second and third portions outside the core extending at angles to the tubular portion, wherein the tubular portion of the first primary conductor comprises an electrical resistance feature configured to increase resistance to a flow of current through the first primary conductor;
the second primary conductor being a flexible wire held inside the tubular portion of the first primary conductor in a substantially coaxial arrangement;
the current transformer further having a secondary winding comprising a plurality of turns on the core; and
a trip circuit responsive to sensed signals on the secondary winding.

2. The miniature circuit breaker of claim 1 wherein the tubular portion of the first primary conductor does not form a fully closed tube.

3. The miniature circuit breaker of claim 1 wherein the electronics are mounted on a printed circuit board.

4. The miniature circuit breaker of claim 1 wherein one of the second and third portions of the first primary conductor is attached to the printed circuit board.

5. The miniature circuit breaker of claim 1 wherein the tubular portion of the first primary conductor comprises a plurality of electrical resistance features.

6. The miniature circuit breaker of claim 1 wherein the electrical resistance feature is on only one end of the tubular portion.

7. The miniature circuit breaker of claim 1 wherein the electrical resistance feature comprises a narrowed wall thickness in a section of the tubular portion.

8. The miniature circuit breaker of claim 1 wherein the electrical resistance feature comprises a through hole in a section of the tubular portion.

9. The miniature circuit breaker of claim 8 wherein the electrical resistance feature comprises a pattern of through holes.

10. The miniature circuit breaker of claim 9 wherein the pattern of through holes are at each end of the tubular portion.

11. The miniature circuit breaker of claim 8 wherein the through-hole comprises a slot.

12. The miniature circuit breaker of claim 11 wherein the slot includes a first outer end, a second outer end, and a center portion, and the slot is wider at the center portion than at the first and second outer ends.

13. The miniature circuit breaker of claim 8 wherein the electrical resistance feature comprises a plurality of holes each comprising a slot.

14. The miniature circuit breaker of claim 1 wherein the first primary conductor is connected to and forms a part of a neutral return power current path.

15. The miniature circuit breaker of claim 1 wherein the first primary conductor is connected to line current.

16. The miniature circuit breaker of claim 1 wherein the tubular portion of the first primary conductor is formed with a 0 degree twist.

17. The miniature circuit breaker of claim 1 wherein the tubular portion of the first primary conductor is formed with a substantially 90 degree twist.

18. The miniature circuit breaker of claim 1 wherein the tubular portion of the first primary conductor is formed with a substantially 180 degree twist.

19. The miniature circuit break of claim 1 wherein one of the second and third portions of the first primary conductor is tubular.

* * * * *